United States Patent [19]
Bench

[11] 3,978,423
[45] Aug. 31, 1976

[54] DYNAMIC EXPANDER

[75] Inventor: Stephen Michael Bench, Lake Zurich, Ill.

[73] Assignee: B-Cubed Engineering, Inc., Elgin, Ill.

[22] Filed: Aug. 19, 1974

[21] Appl. No.: 498,307

[52] U.S. Cl. .............................. 330/141; 330/59; 330/124 R; 330/136
[51] Int. Cl.² ........................................ H03G 7/02
[58] Field of Search ............ 330/59, 130, 136, 141, 330/124 R; 328/116; 307/264; 179/1 VL

[56] References Cited
UNITED STATES PATENTS

| | | | |
|---|---|---|---|
| 2,892,891 | 6/1959 | Manley et al. | 179/1 VL |
| 3,119,970 | 1/1964 | Thompson et al. | 330/136 X |
| 3,333,208 | 7/1967 | Hudak | 330/59 |
| 3,441,867 | 4/1969 | Davison | 330/59 UX |
| 3,699,468 | 10/1972 | Harmgardt | 330/59 X |
| 3,700,811 | 10/1972 | Davidson | 179/1 VL |
| 3,819,957 | 6/1974 | Saeki et al. | 307/264 |

Primary Examiner—James B. Mullins
Attorney, Agent, or Firm—William J. Michals

[57] ABSTRACT

A dynamic expander which is particularly suitable for restoring the original dynamic range of prerecorded stereo sound program material is disclosed. In this embodiment, the expander comprises first and second variable gain amplifiers respectively coupled to a stereo input. The gain of the amplifiers is controlled by a common slow-attack, slow-decay time-constant circuit. An input of the time-constant circuit is coupled to the stereo input and the time-constant circuit responds thereto to provide a control signal which is indicative of the volume of the program material but which varies in accordance with the characteristics of a non-linear element in the time-constant circuit and with the slow-attack and slow-decay characteristics of the time-constant circuit. The control signal of the time-constant circuit drives a light-emitting-diode (LED) which, in turn, determines the resistance of a pair of matched, light-controlled-resistors (LCR's). Each LCR acts linearly and controls the gain of a respective one of the variable gain amplifiers in accordance with the resistance of that LCR.

21 Claims, 1 Drawing Figure

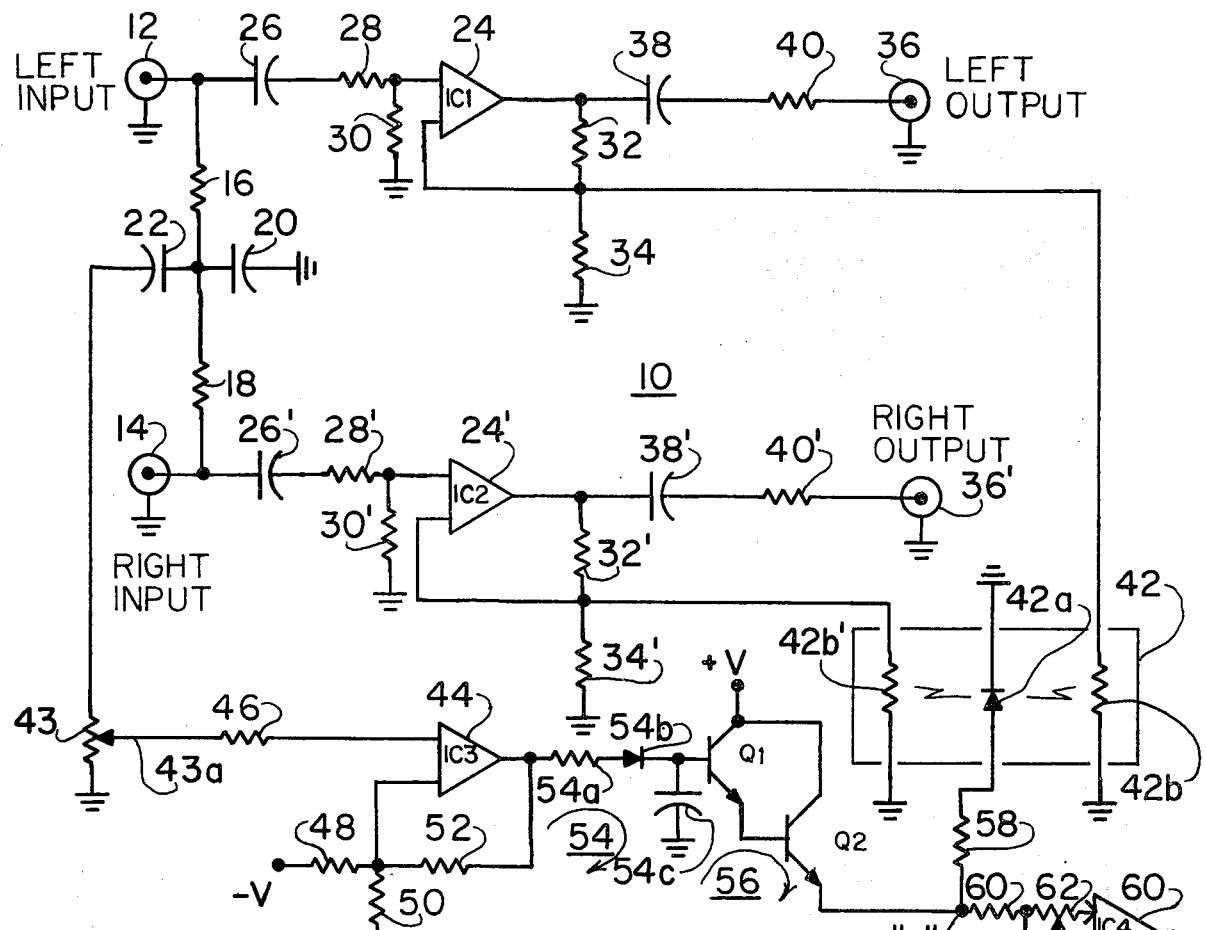
FIG. 1
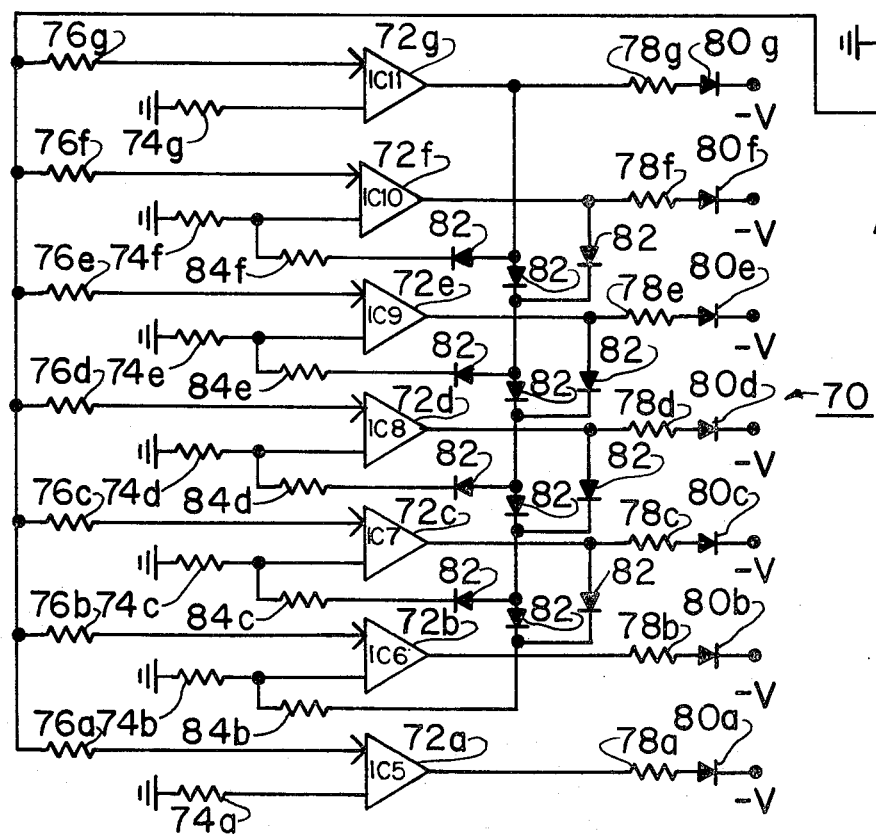

DYNAMIC EXPANDER

BACKGROUND OF THE INVENTION

This invention relates to dynamic expansion and, more particularly, to a dynamic expander which substantially restores the dynamic range of a time-varying signal without adding perceptible distortion.

Dynamic expanders are known in the art and are used to restore the energy distribution of the original program material which is lost due to compression in the recording process. That is, in the recording of program material, particularly musical material, high volume passages are deliberately limited in loudness and otherwise compressed in order to prevent saturation in the master tape. Another reason for this compression is to limit the program material to facilitate pressing of phonographic record discs. This is done to prevent the record groove requirement from becoming excessively wide or even exceeding the physical limitations of the record grooves. The problem arising from this requirement for compression is further aggravated in that low-level passages, which would otherwise be masked in the recording equipment system noise, are in many cases increased in amplitude to improve the signal-to-noise ratio. This increase in amplitude of low-level passages acts to further and undesirably limit the overall dynamic range of the original program material and accordingly, limits the full impact of the original material.

It is therefore the desired function of a dynamic expander to compensate for the compression thereby to restore the original dynamic range and to do so without adding distortion or "coloration" to the original program material. In the prior art, attempts have been made to control the gain of one or more amplifiers of a dynamic expander in order to restore the original dynamic range of the program material. It is known in the prior art that any gained control amplifier typically has, by definition, distortion producing mechanisms largely due to the non-linear devices employed to vary the amplifier gain. Early prior art dynamic expanders nevertheless utilized such distortion producing mechanisms and therefore typically exhibited a characteristic distortion or coloration including distortion commonly known as "breathing" or "pumping". This breathing or pumping is an audible affect wherein both thumping and wide, fluctuating noise level variations accompany the operation of the expander as expansion occurs. Moreover, the use of non-linear control devices and relatively fast gain control signals resulted in intermodulation (IM) between the program material signal and the control signal which, particularly at low program signal frequencies, created very objectionable distortion.

As the prior art developed, the trend to eliminate distortion and breathing was (and still is) to use faster and faster attack times and relatively fast decay times in the circuitry which controls the gain of the amplifiers of the dynamic expander. As this trend developed, the attack and decay times of the gain control signals approached impulse functions relative to the average time period or frequency of the program signal. It is known from information theory, however, that sidebands, intermodulation (IM) and other distortion products are created by such impulse functions. That is, if gain is nearly instantaneously changed (which is a result of faster and faster attack times) sidebands and distortion products occur at the speed of the attack. Consequently, the sidebands and distortion products, which are characteristic of the prior art, normally fall within the audible passband of the program signal and therefore can be heard. This is a problem. Moreover, present day dynamic expanders exhibit distortion due to non-linear gain control; distortion due to intermodulation (IM) between the control signal and the program signal; distortion caused by the intermodulation of the control signal and its own signal envelope; breathing due to the rapid change between expansion and non-expansion modes; and, breathing due to the sidebands created by the fast changing impulse-like control signals.

Another prominent disadvantage of present day dynamic expanders is their limited range which is on the order of 3 to 6 db of maximum obtainable expansion. The maximum expansion is limited to this range because, previous to the invention described hereinafter, in order to exceed this range the resulting distortion and coloration becomes too objectionable.

In the dynamic expander of the present invention, however, these and other disadvantages are overcome by using a technique which is a radical departure from, and contrary to the teachings of, the prior art.

SUMMARY OF THE INVENTION

Briefly, a dynamic expander for expanding the dynamic range of a given time-varying signal is provided. The expander includes input means for receiving the time-varying signal and means for translating the time-varying signal through the expander to an output means which receives the translated signal. The expander includes means responsive to the time-varying signal for increasing the amplitude of the translated signal in accordance with a slow time-constant relative to the time-varying signal and for decreasing the amplitude of the translated signal in accordance with a time-constant which is substantially slower than the slow-time constant.

BRIEF DESCRIPTION OF THE DRAWING

The advantages of this invention will become more readily appreciated as the same becomes better understood by reference to the following detailed description when taken in conjunction with the accompanying drawing wherein the single FIGURE illustrates a combined block and schematic diagram of a dynamic expander in accordance with the present invention.

DETAILED DESCRIPTION

Referring now to the drawing figure there is shown generally at 10 a dynamic expander adapted to receive a given stereo or two channel (Left and Right) input signal. An input means, a phono jack or any other suitable connector 12 receives the Left channel signal and a similar connector 14 receives the Right channel input. Connectors 12 and 14 are respectively coupled by way of resistors 16 and 18 to the junction of capacitors 20 and 22. The other terminal of capacitor 20 is coupled to a point of reference potential such as ground. The Left channel input at connector 12 is coupled to a first input of an operational amplifier 24 by way of a capacitor 26 and a resistor 28. The first input of amplifier 24 is also coupled to ground by way of a resistor 30. The output of amplifier 24 is coupled to a ground by way of a resistive divider comprising a resistor 32 and a resistor 34. The junction of resistors 32 and 34 is coupled to the second input of amplifier 24. The output of amplifier 24 is also coupled to a Left channel output connector 36 by way of decoupling capacitor 38 and a matching resistor 40. The junction of resistors 32 and 34 is also coupled to resistor 42b which is preferrably a light-controlled-resistor. Resistor 42b is also preferrably an integral part of a combination lightemmitting-diode (LED) and light-controlled-resistor (LCR) device 42. For example, device 42 may take the form of an optical coupler wherein the resistance of the LCR varies linearly in accordance with the light output of the LED. As will be discussed more fully hereinafter, device 42 preferably includes a pair of matched LCR's; and in one constructed embodiment device 42 was a Raytheon ECK 8135 Raysistor.

The output of the Right channel connector 14 is coupled to a second operational amplifier 24' by way of a capacitor 26' and a resistor 28'. It can be seen that the circuit of amplifier 24' is structurally identical to the structure of the circuitry of amplifier 24 and accordingly need not be repeated herein.

The other terminal of capacitor 22 is coupled to ground by way of a variable resistor 43. The movable contact 43a of resistor 43 is coupled to a first input of an operational amplifier 44 by way of a resistor 46. The other input of amplifier 44 is coupled to the junction of resistors 48, 50 and 52. The other terminal of resistor 48 is coupled to a fixed point of reference potential (−V). The other terminal of resistor 50 is coupled to ground, and the other terminal of the resistor 52 is coupled to the output of amplifier 44. The output of amplifier 44 is also coupled to a slow-attack time-constant 54 comprising a resistor 54a, a diode 54b, and a capacitor 54c. Capacitor 54c also forms part of a slow-decay time-constant circuit 56 comprising transistors Q1 and Q2, a resistor 58 and device 42.

The junction of the emitter electrode of transistor Q2 and resistor 58 is coupled to a first input of a Norton-type operational 60 by way of a resistor 60 and a variable resistor 62. The second input of amplifier 60 is coupled to ground by way of a resistor 64, and to the output of amplifier 60 by way of a resistor 64, and to the output of amplifier 60 by way of a resistor 66.

The output of amplifier 60 is coupled as an input to analog-to-digital converter 70. Converter 70 includes seven Norton-type operational amplifiers designated 72a–g. Each one of amplifiers 72a–g has a first input respectively coupled to the output of amplifier 60 by way of resistors 76a–g and a second input respectively coupled to ground by way of resistor 74a–g. The output of each one of amplifiers 72a–g is respectively coupled to a point of reference potential (−V) by way of resistors 78a–g and light-emitting diodes (LED's) 80a–g. Converter 70 also includes a network of steering diodes 82 which are coupled together, and to the first input of amplifiers 72b–f by way of resistors 84 and to the outputs of amplifiers 72c–g.

The function of amplifier 60 and its associated circuitry is to perform voltage level shifting or translation between its input and output signals. For example, in one constructed embodiment, signals in the range of 0 to 7 volts at the variable input of amplifier 60 were translated to signals in the range of −V to 0 volts at the output of amplifier 60. As the voltage at the output of amplifier 60 increases, more current is caused to flow through resistor 76a–g. When the respective resulting current flow into amplifiers 72a–g exceeds the current flowing through the corresponding one of resistors 74a–g, an amplifier output transition occurs and the associated one of the LED's at the outputs of amplifiers 72a–g is activated or turned-on. The diodes 82 in the steering diode network are coupled so that as each respective LED is activated, the previous LED is extinguished so that only one of the LED's in the output of amplifiers 72b–g is activated at a given time. The LED in the output circuit of amplifier 72a, however, remains activated during all times when the output voltage of amplifier 60 exceeds a predetermined value.

The values of resistors 76a–g are selected so that the steps between activation of the next-succeeding one of LED's 80a–g corresponds to a given change at the common input of amplifiers 72a–g. The selected value of variable resistor 62 determines when the first LED, i.e. LED 80a in the output of amplifier 72a, is activated and thereafter the successive LED's are activated in selected steps in accordance with resistors 76a–g. Since the input of amplifier 60 is coupled to the emitter electrode of transistor Q2, converter 70 provides a digital and visual indication of the degree of voltage change at the emitter electrode of transistor Q2.

As described hereinafter, this indication is also an indication of the degree of dynamic expansion as provided by expander 10, in accordance with the present invention, and the values of resistors 76a–g are selected to provide 1.5 db steps between activation of the LED's. Thus, converter 70 is a simplified analog-to-digital (A/D) converter having a visual output which changes in a digital although logarithmic fashion.

The above-mentioned Norton-type amplifiers are known in art and accordingly need not be described in detail herein. However, reference may be had to the National Semiconductor Corporation 1973 handbook entitled "Linear Applications" and particularly page AN71-1 et seq. therein. It is noted that the current arrow symbol appearing at the Norton-type inputs of the amplifiers in the present drawing follows the symbol set forth in the above-identified publication.

Similarly, the operation of amplifiers of the type depicted by amplifiers 24 and 24' are believed to be well known in the art and are generally set forth at page AN31-1 of the above-identified handbook. Briefly, however, gain control is accomplished by changing the ratio of resistors 32 and 34 (and 32' and 34') in the feedback path of amplifiers 24 and 24'. As described hereinafter, this ratio is varied by changing the resistance of resistors 42b and 42b' of device 42.

The operation of the dynamic expander 10 is described as follows. The Left and Right stereo channel input signals are respectively applied to connectors 12 and 14. In the embodiment described herein, the stereo input signal represents a given time-varying signal having a degree of compression with respect to the original program material, and expander 10 functions to substantially restore the dynamic range of the original program material. Resistors 16 and 18 function to match the impedance of the stereo signal source; and capacitors 20 and 22 respectively function as low and high-pass filters such that the combined stereo signal at variable resistors 43 exhibits a degree of wave shaping. This wave shaping is preferably selected to approximate the response (i.e., sensitivity curve) of the human ear thereby to provide a more natural sounding expansion or restoration of the original program material. Variable resistor 43 functions to control the maximum level of expansion and couples the combined signal to a first input of amplifier 44.

The output of amplifier 44 drives rectifier-filter circuit 54 which circuit is selected to have relatively slow-attack or long time-constant, e.g., in the range of about 50 to 500 milliseconds. The function of diode 54b is two-fold: (i) to rectify the alternating current signal output of amplifier 44 to thereby charge capacitor 54c to a peak value related to the ac wave form; and, (ii) to provide means for charging capacitor 54c in a non-linear manner. That is, since the value of the ac signal must exceed the diode voltage drop of diode 54d before capacitor 54c can charge, the ac voltage must increase significantly before the voltage at the base electrode of transistor Q1 increases. Further, even for an input signal that increases significantly the resulting voltage at the base electrode of transistor Q1 increases in a non-linear manner corresponding to the non-linear characteristis of diode 54b.

Capacitor 54c discharges through the path provided by the base emitter electrodes of transistors Q1 and Q2, resistor 58 and LED 42a of device 42. Since Q1 and Q2 are arranged as a Darlington pair, the impedance of time-constant circuit 56, as reflected at the base of transistor Q1, is extremely high and, accordingly, the time-constant of circuit 56 is very long e.g., 1 to 10 seconds.

Resistor 48 is selected to provide a quiescent voltage at the emitter of transistor Q2 (point Q) for linear operation of the expander in accordance with the present invention. This quiescent voltage is also selected and adjusted so that the voltage at the second input of amplifier 24, as provided by the resistance of resistor 32 with respect to the resistance of resistor 34 in parallel with resistor 42b of device 42, is equal to the voltage division between resistor 28 and resistor 30 at the first input of amplifier 24. Likewise, the voltage division between resistor 28' and 30' is equal to the voltage division between resistor 32 and resistor 34 in parallel with resistor 42b'. Accordingly, with equal voltage division between the inputs and outputs of amplifiers 24 and 24', when no expansion is present, the gain of each amplifier is 0 db. The selection of a quiescent voltage for a linear or off-set operation, and the corresponding 0 db gain of amplifiers 24 and 24' when no expansion is present, is facilitated by selecting suitable values for resistor 48 and resistor 58.

Following a significant increase of the stereo input signal, which significant increase occurs when compression is present, the voltage at capacitor 54c increases which, in turn, increases the current flow through LED 42a of device 42. When this occurs, the parallel value of resistor 34 and resistor 42b (as well as resistor 34' and resistor 42b') decreases thereby increasing the voltage drop across resistors 32 and 32'. As a result, the output gain of amplifiers 24 and 24' increase substantially and dynamic expansion of the output signals at connectors 36 and 36' occurs.

It can be seen that once the input signal increases significantly —i.e., and indication that compression is present— the control signal at capacitor 54c increases slowly relative to the average period of the input signal and increases in accordance with the transfer function of a non-linear element, i.e., diode 54b. Further, once the input signal decreases —i.e., an indication that compression is subsiding or no longer present— the control signal at 54c decreases very slowly relative to the average period of the input signal. It can also be seen that the control signal is coupled to a linear element, i.e., resistor 42b or 42b', to vary its parameters in accordance with the control signal, which control signal may be varying in a non-linear manner. The linear elements control the gain of amplifiers 24 and 24' in a manner wherein the envelope of their output signals may vary non-linearly but wherein the frequency components of the input signals are translated in a linear manner. Finally, it can also be seen that since the control signal varies at a rate which is essentially or near D.C., the gain of amplifiers 24 and 24' is likewise modulated at a near D.C. rate. Accordingly, the intermodulation (IM) problem, which is characteristic of the prior art, is avoided as information theory states that essentially distortionless operation results when the control is D.C.

It will now be appreciated by those skilled in the art that the present invention provides a dynamic expander wherein linear elements are utilized to control the gain of an amplifier therein and the control is provided in accordance with a slow-attack and very slow-decay control signal. Accordingly, distortion due to non-linear gain control is eliminated as linear control is provided; intermodulation is avoided as the process is linear and the expansion is otherwise too slow to produce perceptable IM; similarly, breathing is avoided as the increase and decrease of the expander output occurs at a speed too slow to be detected.

In this regard, it should be appreciated that the human ear disregards that which it has heard several seconds ago. Accordingly, the expander in accordance with a preferred embodiment of the present invention is inaudible in its expansion operation as its decay characteristics are too slow to be detected by the human ear. Thus, since the attack characteristic are also too slow to create intermodulation, sideband and other distortion, it is virtually impossible for the human ear to sense that expansion may have occurred.

Another important advantage provided by the expander in accordance with the present invention is improvement in signal-to-noise ratio. For example, in one constructed embodiment, 15–20 db of expansion was readily obtained with no observable distortion effects, whereas prior art expanders are limited to 3–6 db of expansion. This increased range of expansion an additional benefit in that the signal-to-noise (S/N) ratio improves in accordance with a 1:1 ratio with the amount of expansion. Accordingly, 20 db of expansion in accordance with one constructed embodiment of the present invention provided a 20 db S/N improvement whereas the comparable S/N improvement of the prior art is on the order of 6 db maximum. It is also pointed out that the teachings of the present invention can be applied in a given embodiment and within the skill of the art to provide an even greater improvement in S/N.

It should now be appreciated that the quescient voltage at the emitter of transistor Q2 acts to provide an offset or non-zero current flowing through LED 42a. This is done to prevent a "sharp turn-on" which would otherwise cause distortion and/or "breathing" to appear in the output signals of expander 10.

It should also be noted that since the LCR's 42b and 42b' are matched and driven by the same LED source, equal increases in signal level occur on each channel even if the expansion dictated by the significant volume increase on one channel is different than the other. This is desirable because when compression of the original program material occurs, it is equally provided on each stereo channel. Thus, in accordance with a feature of the present invention, the original balance between the stereo channels is preserved.

It should be noted that amplifiers 24 and 24' of expander 10, in accordance with the present invention, can be provided as wide-band, high-slew rate variable gain stages. It will be appreciated by those skilled in the art that the bandwidth and slew rate of amplifiers of prior art expands are necessarily slew-rate limited for stability. This is occasioned because of the fast-attack, fast-release sampling and control circuitry used therein to accomplish the expansion in these prior art devices.

As previously discussed, converter 70 provides a visual and digital output of the degree of expansion provided by expander 10 as controlled by the setting of variable resistor 43 and as dictated by the requirements of the compressed input signals. Variable resistor 62 of converter 70 is typically set to provide such a visual indication at LED 80a in the output of amplifier 72a whenever expansion occurs, i.e., to indicate that expansion is occurring. During expansion, LED 80a remains activated in order to provide an indication of the amount of expansion even in a darkened room. That is, in a darkened room, LED's 80a–g would only be recognized as point sources of light. Accordingly, the first LED, i.e., LED 80a at the output of amplifier 72a provides a reference "marker" so that the spatial separation between the two visable sources of light indicates the degree of expansion occurring.

What has been taught, then, is a dynamic expander for restoring the dynamic range of a given time-varying signal. The expander, in accordance with the present invention is particularly suited for prerecorded stereo signals, facilitating, notably, the restoration of prerecorded musical material. It should be understood, however, that the expander in accordance with the present invention can be used with a number of different types of sources of given time-varying signals including prerecorded or "live" program material. Moreover, the expander in accordance with the present invention is not limited to audio frequency time-varying signals but is, indeed, applicable to other time-varying signals such as video frequency signals, optical frequencies, (e.g., light modulators and demodulators in both visable and non-visable spectrums) and at other frequences wherein dynamic expansion of a given time-varying signal is desired. It should now be appreciated that the form of the invention illustrated and described herein is merely a preferred embodiment of one application of these teachings, and in a particular form, which is currently preferred for manufacture. It is shown as an illustration of the inventive concepts, however, rather than by way of limitation, and it is pointed out that various modifications and alterations may be indulged in within the scope of the appended claims.

What is claimed is:

1. A dynamic expander for expanding the dynamic range of a given time-varying signal which varies over a range of levels including a normal signal range between a low signal range and a high signal range, said expander comprising, in combination:

input means for receiving said time-varying signal, means for translating said time-varying signal through said expander and to an output means which output means receives the translated signal; first means coupled to said input means and responsive to said time-varying signal at said input means for gradually increasing the amplitude of said translated signal proportional to amplitude ineases in said time-varying signal at said input means when the level of said time-varying signal exceeds a predetermined high signal level and in accordance with a long time-constant relative to said time-varying signal, thereby to increase the dynamic range of said time-varying signal at said output means and wherein the rate of the increasing amplitude of said translated signal is substantially independent of abrupt changes in the amplitude of said time-varying signal; and, second means cooperating with said first means for gradually decreasing the amplitude of said translated signal relative to subsequent amplitude decreases in said time-varying signal at said input means, and in accordance with a time-constant which is substantially longer than said long time-constant, and wherein the rate of decrease of said translated signal is substantially slower than the rate of increase of said translated signal.

2. The expander according to claim 1, including a linear control element responsive to said first and second means signal and wherein said translated signal is increased and decreased in response to said linear control element.

3. The expander according to claim 1, wherein said first means includes a non-linear element so that said control signal is indicative of the level of said tim-varying signal in a non-linear manner.

4. The expander according to claim 3, wherein said non-linear element comprises a diode.

5. The expander according to claim 1, wherein said means for translating said time-varying signal includes an amplifier whose gain is controlled by said first and second means and wherein said first and second means comprise a slow-attack, slow-decay time-constant circuit having an input coupled to said input means and having an output coupled to said amplifier.

6. The expander according to claim 5, including means coupled between said time-constant circuit and said amplifier for varying the gain of said amplifier in accordance with the slow-attack and slow-decay characteristics of said time-constant circuit whereby distortion of said translated signal is avoided.

7. The expander according to claim 6, wherein said means coupled between said time-constant circuit and said amplifier comprises a light-emitting-diode coupled to said time-constant circuit and a light-variable-resistance optically coupled to said diode and coupled to said amplifier to vary the gain of said amplifier in accordance with the resistance of said light-variable resistance.

8. The expander according to claim 7, further including a non-linear element coupled between said input means and said input of said time-constant circuit so that said time-constant circuit responds to said time-varying signal in accordance with the non-linear transfer function of said element.

9. The expander according to claim 1, wherein said second means is responsive to said first means.

10. The expander to claim 1, wherein said long time-constant is in the range of about 50 to 500 milliseconds and wherein said substantially longer time-constant is in the range of about 1 to 10 seconds.

11. A dynamic expander for expanding the dynamic range of a given time-varying signal the amplitude of which varies over a predetermined dynamic range of amplitude levels including a limited range of high levels above a range of intermediate levels, said expander comprising, in combination:

input means for receiving said time-varying signal;

at least one variable gain amplifier, each amplifier having an input coupled to said input means and each amplifier having an output;

means coupled to said input means for sensing said time-varying signal to provide a signal indicative of the amplitude of said time-varying signal;

means coupled to the sensing means for deriving a control signal whose level increases gradually and proportional to said time-varying signal when the amplitude of said time-varying signal increases significantly above said intermediate levels and whose level increases at a rate determined by a first predetermined time period which time period is substantially greater than the average time period of said time-varying signal, and whose level gradually decreases at a rate determined by a predetermined time period following a decrease in the amplitude of said time-varying signal after said first period, wherein said second period is substantially greater than said first period and wherein the rate of change in the level of said control signal is substantially independent of abrupt changes in the amplitude of said time-varying signal;

means for coupling said control signal to each amplifier for controlling the gain of each amplifier to vary the amplitude of the output signal of each amplifier in accordance with the level of said control signal; and, means for deriving the controlled output signal from each amplifier.

12. The expander according to claim 11, wherein said first time period is in the range of about 50 to 500 milliseconds and wherein said second time period is in the range of about 1 to 10 seconds.

13. The expander according to claim 12, wherein said means for coupling said control signal to each amplifier includes at least one linear element responsive to said control signal and wherein the gain of each amplifier is varied by said linear element.

14. The expander according to claim 13, wherein said means for deriving a control signal includes a non-linear element coupled between said input means and said linear element so that the amplitude of said control signal increases in accordance with the non-linear transfer function of said non-linear element.

15. The expander according to claim 13, wherein said linear element comprises a resistive impedance whose resistance varies in accordance with said control signal and wherein the gain of each amplifier varies in accordance with said resistance.

16. The expander according to claim 15, wherein said linear element comprises a light-controlled-resistor and wherein said means for coupling said control includes a light-emitting-diode electrically coupled to said means for deriving a control signal and optically coupled to said light-controlled-resistor.

17. The expander according to claim 11 wherein there is included at least two of said variable gain amplifiers, wherein said time-varying siignal comprises a multi-channel input signal having at least first and second channel input signals respectively coupled to said two amplifiers and wherein said control signal is indicative of a combination of said first and second channel input signals.

18. The expander according to claim 17, including filtering means coupled between said input means and said control signal deriving means for altering the frequency characteristics of said control signal.

19. A dynamic expander for restoring the dynamic range of a given previously compressed time-varying signal the level of which varies over a range of levels including an intermediate range between a low signal range and an upper compression range, said expander comprising:

input means for receiving said time-varying; signal;

a variable gain amplifier having an input coupled to said input means;

a slow-attack, slow-decay time-constant circuit having an input coupled to said input means and responding to said time-varying signal when said time-varying signal is in said compression range to provide a control signal the level of which is substantially proportional to the compression levels of said time-varying signal at said input means but which varies gradually in accordance with the slow-attack and slow-decay characteristics of said time constant circuit wherein the rates of increase and decrease of said control signal gradual and substantially inndependent of abrupt changes in the level of said time-varying signal;

a variable resistive impedance element coupled to said time-constant circuit and responsive to said control signal to vary the resistance of said element in accordance with the gradual variations in the level of said control signal;

means for coupling said element to said amplifier to control the gain of said amplifier in accordance with the resistance of said element; and, means for deriving an output signal from said amplifier.

20. The expander according to claim 19, including a light-emitting-diode coupled to said time-constant circuit, said diode providing an optical output in accordance with said control signal; and wherein said variable element comprises a light-controlled-resistor optically coupled to said diode and further coupled to said resistor varies in response to variations in the optical output of said diode, and wherein the gain of said amplifier varies in accordance with said resistance of said resistor.

21. The expander according to claim 20, including a second variable gain amplifier having an input coupled to said input means and wherein the gain of said second amplifier is controlled by a second light-controlled-resistor optically coupled to said diode and further coupled to said second amplifier and wherein time-varying signal is a multi-channel signal having at least first and second channels respectively coupled to said amplifiers.

* * * * *